US012732153B2

(12) United States Patent
Yamane et al.

(10) Patent No.: US 12,732,153 B2
(45) Date of Patent: Sep. 8, 2026

(54) ACOUSTIC WAVE DEVICE

(71) Applicant: Murata Manufacturing Co., Ltd., Nagaokakyo (JP)

(72) Inventors: Takashi Yamane, Nagaokakyo (JP); Patrick Turner, Portola Valley, CA (US); Ventsislav Yantchev, Sofia (BG); Bryant Garcia, Mississaugna (CA); Robert B. Hammond, Rockville, MD (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 725 days.

(21) Appl. No.: 18/205,251

(22) Filed: Jun. 2, 2023

(65) Prior Publication Data

US 2023/0308072 A1 Sep. 28, 2023

Related U.S. Application Data

(63) Continuation of application No. PCT/US2021/061576, filed on Dec. 2, 2021.

(Continued)

(51) Int. Cl.

| | |
|---|---|
| ***H03H 9/02*** | (2006.01) |
| ***H03H 9/13*** | (2006.01) |
| ***H03H 9/17*** | (2006.01) |

(52) U.S. Cl.

CPC .... *H03H 9/02102* (2013.01); *H03H 9/02031* (2013.01); *H03H 9/02157* (2013.01);

(Continued)

(58) Field of Classification Search

CPC ...... H03H 9/173; H03H 9/02157; H03H 9/13; H03H 9/02102; H03H 9/02133;

(Continued)

(56) References Cited

U.S. PATENT DOCUMENTS

| | | | | |
|---|---|---|---|---|
| 11,621,688 B2 * | 4/2023 | Yamane | ................ | H03H 9/174 333/192 |
| 2007/0296304 A1 | 12/2007 | Fujii et al. | | |

(Continued)

FOREIGN PATENT DOCUMENTS

| | | |
|---|---|---|
| JP | 2012257019 A | 12/2012 |
| KR | 1020130064334 A | 6/2013 |

(Continued)

OTHER PUBLICATIONS

International Search Report in PCT/US2021/061576, mailed Mar. 29, 2022, 3 pages.

*Primary Examiner* — J. San Martin

(74) *Attorney, Agent, or Firm* — ArentFox Schiff LLP

(57) ABSTRACT

An acoustic wave device is provided that includes a support substrate including top and bottom surfaces and a cavity or air gap, a piezoelectric layer supported by the support substrate and including top and bottom surfaces, and an electrode on a surface of the piezoelectric layer and including top and bottom surfaces. At least a portion of the electrode is over the cavity or the air gap, and an equation $0.002\ Tg \leq 0.5(Lb-Ls) < Te$ is satisfied, where Ls is a maximum length of the top surface of the electrode, Lb is a maximum length of the bottom surface of the electrode, Tg is a distance between the top surface of the piezoelectric layer and the top surface of the support substrate, and Te is a thickness of the electrode.

20 Claims, 10 Drawing Sheets

Related U.S. Application Data

(60) Provisional application No. 63/121,343, filed on Dec. 4, 2020.

(52) U.S. Cl.
CPC .............. *H03H 9/13* (2013.01); *H03H 9/173* (2013.01); *H03H 9/176* (2013.01)

(58) Field of Classification Search
CPC ............... H03H 9/02228; H03H 9/176; H03H 9/02031; H03H 9/02543; H03H 9/02015
See application file for complete search history.

(56) References Cited

U.S. PATENT DOCUMENTS

| | | | | |
|---|---|---|---|---|
| 2013/0147320 | A1 | 6/2013 | Son et al. | |
| 2014/0018126 | A1 | 1/2014 | Asai et al. | |
| 2015/0145374 | A1 | 5/2015 | Xu et al. | |
| 2017/0250671 | A1 | 8/2017 | Omura et al. | |
| 2023/0198495 | A1* | 6/2023 | Ouchi | H03H 9/02228 310/313 A |
| 2025/0023546 | A1* | 1/2025 | Daimon | H03H 9/02228 |
| 2026/0088800 | A1* | 3/2026 | Iyama | H03H 9/605 |

FOREIGN PATENT DOCUMENTS

| | | | | |
|---|---|---|---|---|
| KR | 1020140010102 A | | 1/2014 | |
| WO | WO-2024055388 A1 | * | 3/2024 | H03H 9/02015 |

* cited by examiner

2a
A
1
5
3
3
2
6
4
4
7
A
8
2b 3
4
3
5
C
4
6

FIG. 2
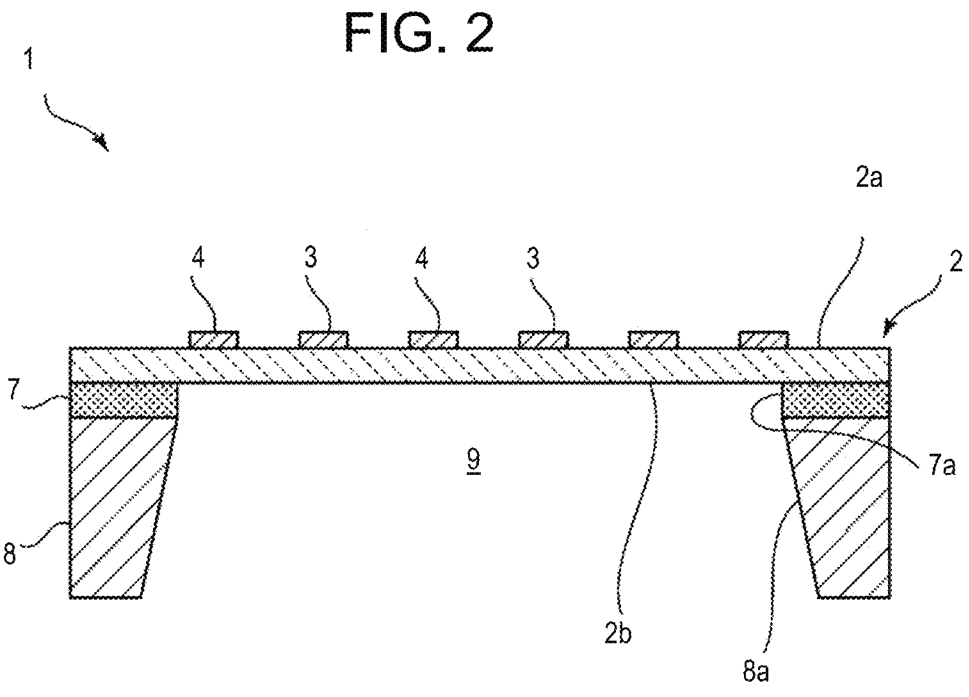
FIG. 3A
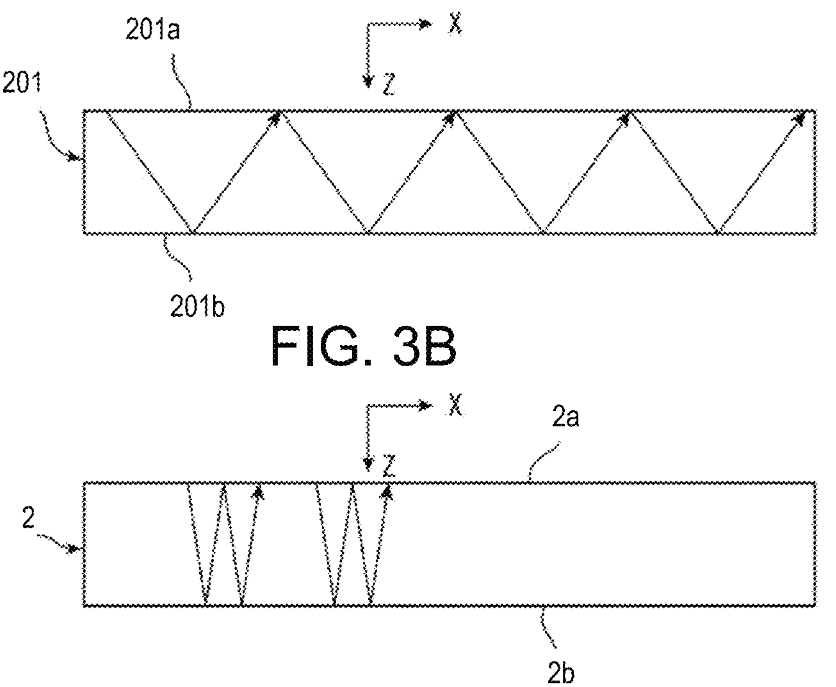
FIG. 3B 2
2a
451
VP1
452
ACOUSTIC WAVE PROPAGATION DIRECTION (THICKNESS DIRECTION)
PARTICLE DISPLACEMENT DIRECTION
2b

ACOUSTIC WAVE DEVICE

CROSS REFERENCE TO RELATED APPLICATIONS

This application is a continuation of PCT/US2021/061576, filed Dec. 2, 2021, which claims the benefit of priority to U.S. Patent Provisional Application No. 63/121,343 filed on Dec. 4, 2020. The entire contents of each of these applications are hereby incorporated herein by reference.

TECHNICAL FIELD

The present invention relates to acoustic wave devices each including a piezoelectric layer of lithium niobate or lithium tantalate.

BACKGROUND

Currently, in existing acoustic wave devices, it is difficult both to adjust frequency and to suppress spurious occurrences.

One technique is to change a film thickness of a protective film that covers the electrodes of known acoustic wave devices, e.g., the interdigital transducer electrodes, to adjust the frequency of the acoustic wave devices. But, when the protective film covers both series arm and parallel arm resonators of a ladder filter, changes to the film thickness of the protective film similarly affect both the series arm resonators and the parallel arm resonators, which causes the fractional bandwidth to increase, resulting in more spurious occurrences.

SUMMARY OF THE INVENTION

In an exemplary embodiment, acoustic wave devices are provided that include a least one electrode located on a piezoelectric layer and at least partially over a cavity or air gap such that, when the temperature of the acoustic wave device or the ambient temperature of the acoustic wave device changes, stress in the piezoelectric-layer side of the electrode can be distributed, which reduces or suppresses polarization reversal in the piezoelectric layer. In an exemplary configuration, $0.002\ Tg \leq 0.5(Lb-Ls) < Te$, where Ls is a maximum length of the top surface of the electrode, Lb is a maximum length of the bottom surface of the electrode, Tg is a distance between the top surface of the piezoelectric layer and the cavity or air gap.

According to an exemplary embodiment, an acoustic wave device includes a support substrate; a piezoelectric layer including a first and second major surfaces that oppose each other, with the second major surface being in a first direction with respect to the first major surface; at least one pair of functional electrodes facing each other in a second direction intersecting with the first direction, and provided adjacently to each other on at least one of the first and second major surfaces; and a space defining either a cavity in the support substrate or an air gap between the support substrate and the piezoelectric layer. The space overlaps with at least a portion of the at least one pair of functional electrodes, in a planar view in the first direction. A value of half a difference between a maximum length of a bottom surface of one of the at least one pair of functional electrodes in the second direction and a maximum length of a top surface of the one of the at least one pair of functional electrodes in the second direction is equal to or more than about 0.2% of a thickness of the piezoelectric layer from the first major surface to the space, and is equal to or less than a thickness of the one of the at least one pair of functional electrodes in the first direction.

In an exemplary aspect, the value of half the difference between the maximum length of the bottom surface of the one of the least one pair of functional electrodes in the second direction and the maximum length of the top surface of the one of the at least one pair of functional electrodes in the second direction can be equal to or more than about 0.9% of the thickness of the piezoelectric layer from the first major surface to the space.

In an exemplary aspect, the value of half the difference between the maximum length of the bottom surface of the one of the at least one pair of functional electrodes in the second direction and the maximum length of the top surface of the one of the at least one pair of functional electrodes in the second direction can be equal to or more than about 2% of the thickness of the piezoelectric layer from the first major surface to the space.

Moreover, in an exemplary aspect, in a cross section including the first direction and the second direction, the one of the at least one pair of functional electrodes can include a first side and a second side, and the first side and/or the second side can include a curved portion.

Moreover, the thickness of the piezoelectric layer between the first and second major surfaces can be equal to or more than about 0.05 μm and equal to or less than about 1 μm in an exemplary aspect. An electrically insulating layer can also be provided between the piezoelectric layer and the support substrate.

The one of the least one pair of functional electrodes can include a plurality of first electrodes, a first busbar electrode connected to the plurality of first electrodes, a plurality of second electrodes, and a second busbar electrode connected to the plurality of second electrodes. In an exemplary aspect, a thickness of the piezoelectric layer can be equal to or more than 2p, where p is a center-to-center distance between a first electrode and a second electrode that are adjacent to each other among the first electrodes and the second electrodes.

The piezoelectric layer can comprises one of lithium niobate or lithium tantalate. A first-order thickness-shear mode bulk wave can be used as a main wave. The one of the least one pair of functional electrodes can include at least one pair of electrodes that face each other, and a ratio d/p can be equal to or less than about 0.5 where d is a thickness of the piezoelectric layer, and p is a center-to-center distance between the at least one pair of electrodes that face each other adjacent to each other.

The functional electrode can be an IDT electrode, and a plate wave can be used as a main wave.

According to another exemplary embodiment, an acoustic wave device can include a support substrate including top and bottom surfaces and a cavity or air gap, a piezoelectric layer on the top surface of the support substrate and including first and second surfaces that oppose each other, and an electrode on at least one of the first and second surfaces of the piezoelectric layer and including top and bottom surfaces. At least a portion of the electrode is over the cavity or the air gap. In this configuration, $0.002\ Tg \leq 0.5(Lb-Ls) < Te$, where Ls is a maximum length of the top surface of the electrode, Lb is a maximum length of the bottom surface of the electrode, Tg is a distance between the top surface of the piezoelectric layer and the top surface of the support substrate, and Te is a thickness of the electrode.

In another exemplary aspect, $0.009\ Tg \leq 0.5(Lb-Ls)$, or $0.02\ Tg \leq 0.5(Lb-Ls)$.

At least one of a first side and a second side of the electrode can include a curved portion. The electrode can include first electrodes, a first busbar electrode connected to the first electrodes, second electrodes, and a second busbar electrode connected to the second electrodes. The piezoelectric layer can comprise one of lithium niobate or lithium tantalate. A first-order thickness-shear mode bulk wave can be used as a main wave. The electrode can be an IDT electrode, and a plate wave can be used as a main wave.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a cross-sectional view taken along the line A-A in FIG. 1A.

FIG. 3A is a schematic elevational cross-sectional view that shows a Lamb wave propagating in a piezoelectric film of an acoustic wave device.

FIG. 3B is a cross-sectional view that shows a bulk wave propagating in a piezoelectric film of an acoustic wave device.

DETAILED DESCRIPTION OF THE EMBODIMENTS

Exemplary embodiments of the present invention include a piezoelectric layer 2 made of lithium niobate or lithium tantalate, and first and second electrodes 3, 4 opposed in a direction that intersects with a thickness direction of the piezoelectric layer 2.

A bulk wave in a first thickness-shear mode is used. In addition, the first and the second electrodes 3, 4 can be adjacent electrodes, and, when a thickness of the piezoelectric layer 2 is d and a center-to-center distance between a center of the first electrode 3 and a center of the second electrode 4 is p (i.e., a pitch of the electrodes), a ratio d/p can be less than or equal to about 0.5, for example. With this configuration, the size of the acoustic wave device can be reduced, and the Q value can be increased. In operation, Lamb waves as plate waves can be used, and resonance characteristics due to the Lamb waves can be obtained.

Figure 1A:
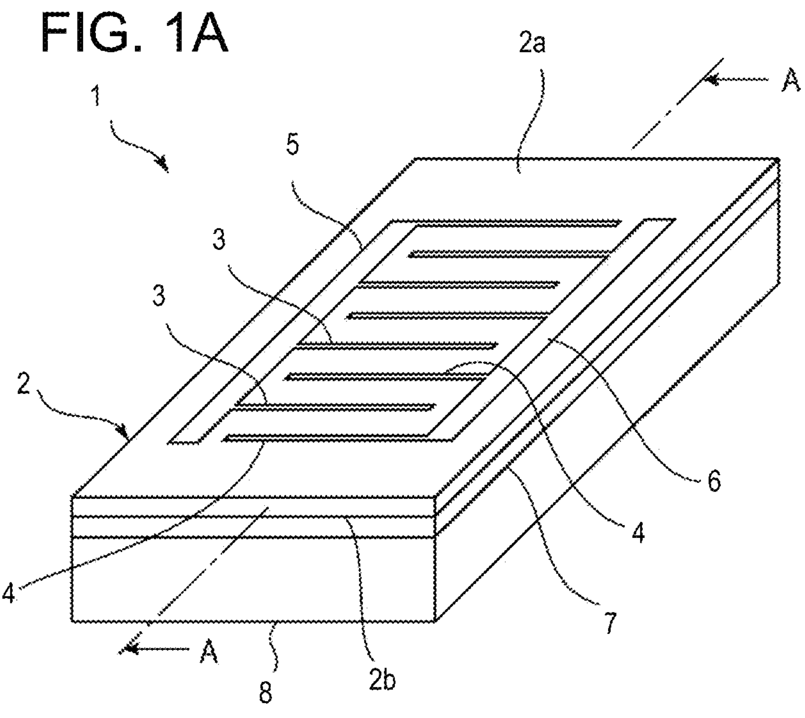
FIG. 1A is a schematic perspective view showing an acoustic wave device according to a first exemplary embodiment.

In an exemplary aspect, an acoustic wave device 1 includes a piezoelectric layer 2 made of $LiNbO_3$ (lithium niobate). The piezoelectric layer 2 can also be made of $LiTaO_3$ (lithium tantalate). Moreover, the cut angle of $LiNbO_3$ or $LiTaO_3$ can be Z-cut or can be rotated Y-cut or X-cut. A propagation direction of Y propagation or X propagation of about ±30° can be used, for example. It is noted that the thickness of the piezoelectric layer 2 is not limited and can be greater than or equal to about 50 nm and can be less than or equal to about 1000 nm, for example, to effectively excite a first thickness-shear mode. The piezoelectric layer 2 has opposed first and second major surfaces (or top and bottom surfaces) 2*a*, 2*b*. In an exemplary aspect, the electrodes 3, 4 are provided on the first major surface 2*a*. However, in an alternative aspect, the electrodes 3, 4 can be provided on the second major surface 2*b* and/or on both major surfaces 2*a* and 2*b*. For purposes of this disclosure, the electrodes 3 are examples of the "first electrode," and the electrodes 4 are examples of the "second electrode." In FIG. 1A and FIGS. 1B, the plurality of electrodes 3 is connected to a first busbar 5, and the plurality of electrodes 4 is connected to a second busbar 6. The electrodes 3, 4 can be interdigitated with each other.

In an exemplary aspect, the electrodes 3, 4 each can have a rectangular or substantially rectangular shape and can have a length direction. In a direction perpendicular to the length direction, each of the electrodes 3 and an adjacent one of the electrodes 4 are opposed to each other. The length direction of the electrodes 3, 4 and the direction perpendicular to the length direction of the electrodes 3, 4 both are directions that intersect (e.g., orthogonal) with a thickness direction of the piezoelectric layer 2. For this reason, each of the electrodes 3 and the adjacent one of the electrodes 4 can be regarded as being opposed to each other in the direction that intersects with the thickness direction of the piezoelectric layer 2. Alternatively, the length direction of the electrodes 3, 4 can be interchanged by the direction perpendicular to the length direction of the electrodes 3, 4, shown in FIGS. 1A and 1B. In other words, in FIGS. 1A and 1B, the electrodes 3, 4 can be extended in a direction in which the first busbar 5 and the second busbar 6 extend. In this case, the first busbar 5 and the second busbar 6 extend in the direction in which the electrodes 3, 4 extend in FIGS. 1A and 1B. Pairs of adjacent electrodes 3 connected to a first potential and electrodes 4 connected to a second potential are provided in the direction perpendicular to the length direction of the electrodes 3, 4. A state where the electrodes 3, 4 are adjacent to each other does not mean that the electrodes 3, 4 are in direct contact with each other and instead means that the electrodes 3, 4 are disposed via a gap in between. When the electrodes 3, 4 are adjacent to each other, no electrode connected to a hot electrode or a ground electrode, including the other electrodes 3, 4, are disposed between the electrodes 3, 4.

In general, it is noted that the number of the pairs of electrodes 3, 4 is not necessarily an integer number of pairs and can be 1.5 pairs, 2.5 pairs, or the like. For example, 1.5 pairs of electrodes means that there are three electrodes 3, 4, two of which are in a pair of electrodes and one of which is not in a pair. Moreover, a center-to-center distance between the centers of the electrodes 3, 4, that is, the pitch of the electrodes 3, 4, can fall within the range of greater than or equal to about 1 μm and less than or equal to about 10 μm, for example. A center-to-center distance between the centers of the electrodes 3, 4 can be a distance between the center of the width dimension of the electrodes 3, 4 in the direction perpendicular to the length direction of the electrodes 3, 4. In addition, when there is more than one electrode 3, 4 (e.g., when the number of electrodes 3, 4 is two such that the electrodes 3, 4 define an electrode pair, or when the number of electrodes 3, 4 is three or more such that electrodes 3, 4 define 1.5 or more electrode pairs), a center-to-center distance between the centers of the electrodes 3, 4 means an average of a distance between any adjacent electrodes 3, 4 of the 1.5 or more electrode pairs. In addition, the width (or "mark") of each of the electrodes 3, 4, that is, the dimension of each of the electrodes 3, 4 in the opposed direction that is perpendicular to the length direction, can fall within the range of greater than or equal to about 150 nm and less than or equal to about 1000 nm, for example. A center-to-center distance between the centers of the electrodes 3, 4 can be a distance between the center of the dimension of the electrode 3 in the direction perpendicular to the length direction of the electrode 3 (width dimension) and the center of the dimension of the electrode 4 in the direction perpendicular to the length direction of the electrode 4 (width dimension).

Because the Z-cut piezoelectric layer 2 can be used, the direction perpendicular to the length direction of the electrodes 3, 4 is a direction perpendicular to a polarization direction of the piezoelectric layer 2. It should be appreciated that when a piezoelectric body with another cut angle is used as the piezoelectric layer 2, this does not apply. Moreover, the term "perpendicular" is not limited only to a strictly perpendicular case and can be substantially perpendicular (e.g., an angle formed between the direction perpendicular to the length direction of the electrodes 3, 4 and the polarization direction can be, for example, about 90°±10°).

As further shown, a support substrate 8 can be laminated via an electrically insulating layer or a dielectric film 7 to the second major surface 2*b* of the piezoelectric layer 2. As shown in FIG. 2, the electrically insulating layer 7 can have a frame shape and can include an opening portion 7*a*, and the support substrate 8 can have a frame shape and can include an opening portion 8*a*. With this configuration, a space, including, for example, a cavity 9 or an air gap, can be formed. The cavity 9 can be provided (e.g., with sufficient depth) so as not to impede vibrations of an excitation region C of the piezoelectric layer 2. Therefore, the support substrate 8 can be laminated to the second major surface 2*b* via the electrically insulating layer 7 at a location that does not overlap a portion where at least one electrode pair is provided. It is noted that the electrically insulating layer 7 does not need to be provided in an alternative aspect. Therefore, the support substrate 8 can be laminated directly or indirectly on the second major surface 2*b* of the piezoelectric layer 2.

The electrically insulating layer 7 can be made of silicon dioxide. However, other than silicon dioxide, an appropriate electrically insulating material, such as silicon oxynitride or alumina, can also be used. The support substrate 8 can be made of Si or other suitable material. A plane direction of the Si can be (100) or (110) or (111). High-resistance Si with a resistivity higher than or equal to about 4 kΩ, for example, can be used. The support substrate 8 can also be made of an appropriate electrically insulating material or an appropriate semiconductor material. Examples of the material of the support substrate 8 include a piezoelectric body, such as aluminum oxide, lithium tantalate, lithium niobate, and quartz crystal; various ceramics, such as alumina, magnesia, sapphire, silicon nitride, aluminum nitride, silicon carbide, zirconia, cordierite, mullite, steatite, and forsterite; a dielectric, such as diamond and glass; and a semiconductor, such as gallium nitride.

The first and the second electrodes 3, 4 and the first and the second busbars 5, 6 can be made of an appropriate metal or alloy, such as Al or AlCu alloy. The first and the second electrodes 3, 4 and the first and second busbars 5, 6 can include a structure such as an Al film that can be laminated on a Ti film. An adhesive layer other than a Ti film can be used.

To drive the acoustic wave device 1, alternating-current voltage is applied between the first and the second electrodes 3, 4. In operation, alternating-current voltage is applied between the first and the second busbar 5, 6 to enable resonance characteristics by using a bulk wave in a first-order thickness-shear mode in the piezoelectric layer 2. In the acoustic wave device 1, when the thickness of the piezoelectric layer 2 is d and a distance between the centers of adjacent first and second electrodes 3, 4 of the electrode pairs is p, the ratio d/p can be less than or equal to about 0.5, for example. For this reason, a bulk wave in the first-order thickness-shear mode can be effectively excited, which results in good resonant characteristics being obtained. The ratio d/p can less than or equal to about 0.24, and, in this case, further good resonant characteristics can be obtained. When there is more than one electrode, the center-to-center distance p between the centers of the adjacent electrodes 3, 4 is an average distance of the distance between the centers of any adjacent electrodes 3, 4.

With the above configuration according to an exemplary aspect, the Q value of the acoustic wave device 1 is unlikely to decrease, even when the number of electrode pairs is reduced for size reduction. In particular, the Q value is unlikely to decrease if the number of electrode pairs is reduced because the acoustic wave device 1 is a resonator that needs no reflectors on both sides, and therefore, a propagation loss is small. No reflectors are needed because a bulk wave in a first-order thickness-shear mode is used.

The difference between a Lamb wave used in known acoustic wave devices and a bulk wave in the first-order thickness-shear mode of an exemplary embodiment is described with reference to FIGS. 3A and 3B.

FIG. 3A is a schematic elevational cross-sectional view for illustrating a Lamb wave propagating in a piezoelectric film of an acoustic wave device as described in Japanese Unexamined Patent Application Publication No. 2012-257019.

In this example, the wave propagates in a piezoelectric film 201 as indicated by the arrows in FIG. 3A. In the piezoelectric film 201, a first major surface 201*a* and a second major surface 201*b* are opposed to each other, and a thickness direction connecting the first major surface 201*a* and the second major surface 201*b* is a Z direction. An X direction is a direction in which electrode fingers of an interdigital transducer electrode are arranged. As shown in FIG. 3A, a Lamb wave propagates in the X direction. The Lamb wave is a plate wave, so the piezoelectric film 201 vibrates as a whole, but the wave propagates in the X direction. Therefore, resonant characteristics are obtained by arranging reflectors on both sides. For this reason, a wave propagation loss occurs, and the Q value decreases when the size is reduced, that is, when the number of electrode pairs is reduced.

In contrast, as shown in FIG. 3B, in the acoustic wave device 1, a vibration displacement is caused in the thickness-shear direction, so the wave propagates substantially in the direction connecting the first and the second major surfaces 2*a*, 2*b* of the piezoelectric layer 2, that is, the Z direction, and resonates. In other words, the X-direction component of the wave is significantly smaller than the Z-direction component. Since the resonant characteristics are obtained from the propagation of the wave in the Z direction, no reflectors are needed. Thus, there is no propagation loss caused when the wave propagates to reflectors. Therefore, even when the number of electrode pairs is reduced to reduce size, the Q value is unlikely to decrease.

Figure 1B:
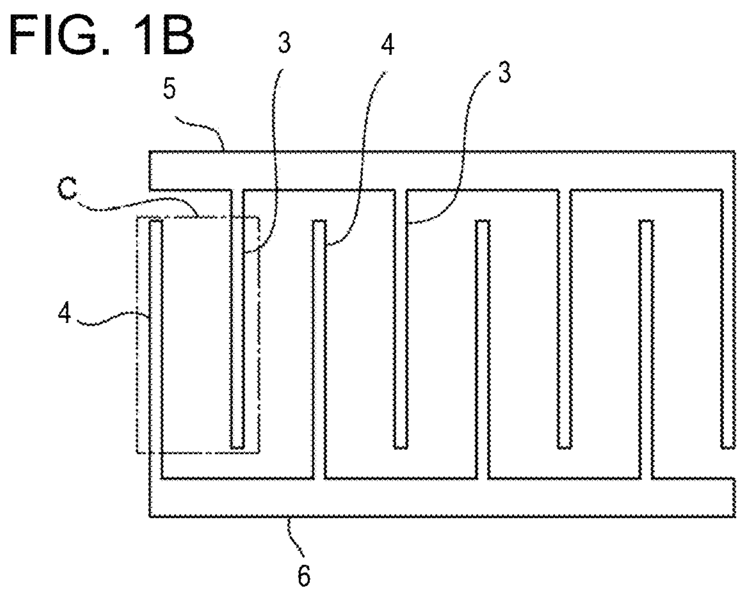
FIG. 1B is a plan view showing an electrode structure on a piezoelectric layer.
Figures 4, 5:
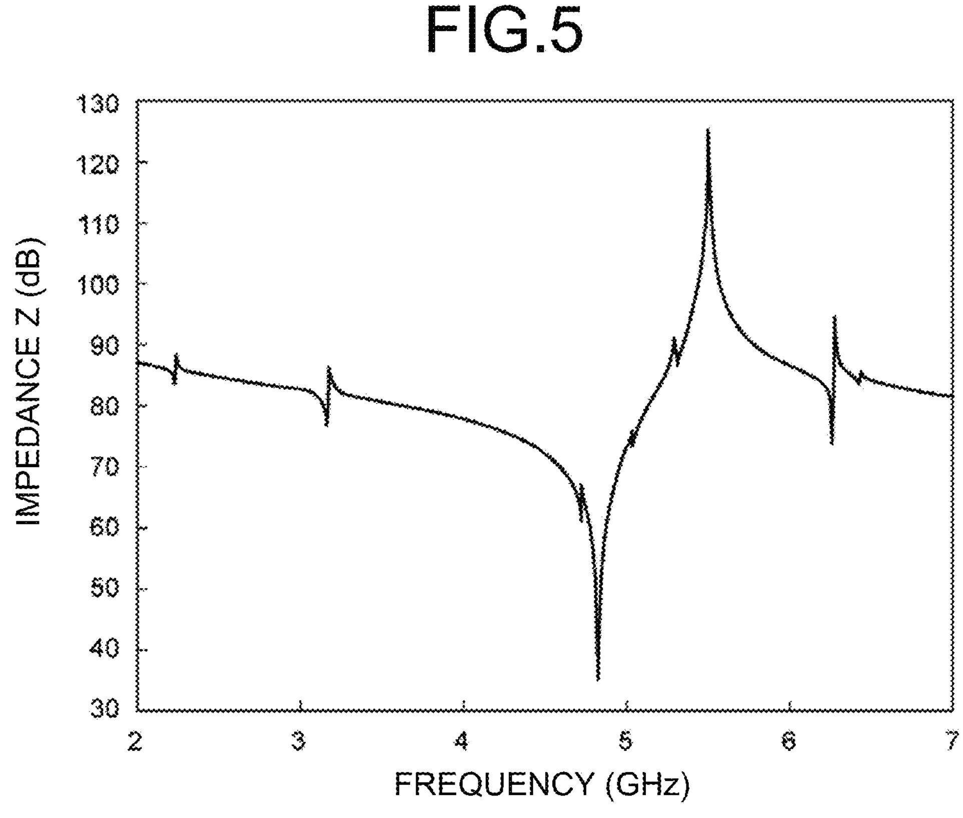
FIG. 4 schematically shows a bulk wave when a voltage is applied across the electrodes of an acoustic wave device.
FIG. 5 is a graph showing the resonant characteristics of the acoustic wave device according to the first exemplary embodiment.

As shown in FIG. 4, the amplitude direction of the bulk wave in the first-order thickness-shear mode is opposite between a first region 451 included in the excitation region C of the piezoelectric layer 2 and a second region 452 included in the excitation region C, where the excitation region C is shown in FIG. 1B. FIG. 4 schematically shows a bulk wave when a higher voltage is applied to the electrodes 4 than a voltage applied the electrodes 3. The first region 451 is a region in the excitation region C between the first major surface 2*a* and a virtual plane VP1 that is perpendicular to the thickness direction of the piezoelectric layer 2 and that divides the piezoelectric layer 2 into two. The second region 452 is a region in the excitation region C between the virtual plane VP1 and the second major surface 2*b*.

As described above, the acoustic wave device 1 includes at least one electrode pair. However, the wave is not propagated in the X direction, so the number of electrode pairs 4 does not necessarily need to be two or more. In other words, only one electrode pair can be provided in an exemplary aspect.

For example, the first electrode 3 is an electrode connected to a hot potential, and the second electrode 4 is an electrode connected to a ground potential. Alternatively, the first electrode 3 can be connected to a ground potential, and the second electrode 4 can be connected to a hot potential. Each first or second electrode 3, 4 is connected to a hot potential or is connected to a ground potential as described above, and no floating electrode is provided.

FIG. 5 is a graph showing the resonant characteristics of the acoustic wave device 1. The design parameters of the acoustic wave device 1 having the resonant characteristics can be as follows. In this example, the piezoelectric layer 2 is made of $LiNbO_3$ with Euler angles of (0°, 0°, 90°) and has a thickness of about 400 nm, for example. But, as explained above, the piezoelectric layer 2 can be $LiTaO_3$, and other suitable Euler angles and thicknesses can be used in alternative aspects.

When viewed in a direction perpendicular to the length direction of the first and the second electrodes 3, 4, the length of a region in which the first and the second electrodes 3, 4 overlap, that is, the excitation region C, can about 40 μm, the number of electrode pairs of electrodes 3, 4 can be 21, the distance between the centers of the first and the second electrodes 3, 4 can be about 3 μm, the width of each of the first and the second electrodes 3, 4 can be about 500 nm, and the ratio d/p can be about 0.133, for example.

The electrically insulating layer 7 can be made of a silicon dioxide film having a thickness of about 1 μm, for example. Moreover, the support substrate 8 can be made of Si and the length of the excitation region C can be along the length direction of the first and the second electrodes 3, 4.

The distance between any adjacent electrodes of the electrode pairs can be equal or substantially equal within manufacturing and measurement tolerances among all of the electrode pairs. In other words, the first and the second electrodes 3, 4 can be disposed with an equal pitch or a substantially equal pitch.

As illustrated from FIG. 5, although no reflectors are provided, good resonant characteristics with a fractional bandwidth of about 12.5% can be obtained.

When the thickness of the piezoelectric layer 2 is d and the center-to-center distance between the centers of the electrode pairs is p, the ratio d/p can be less than or equal to about 0.5 or can be less than or equal to about 0.24, for example. The ratio d/p will be further discussed with reference to FIG. 6 below.

Figure 6:
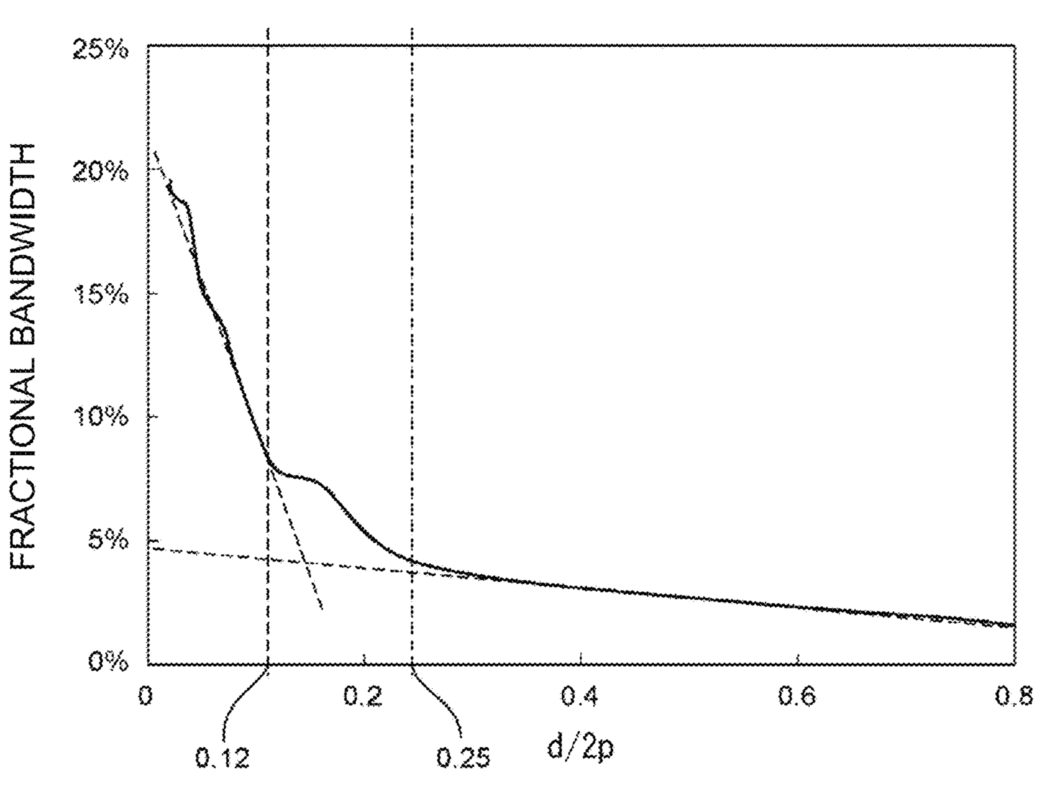
FIG. 6 is a graph showing the relationship between the ratio d/p and the fractional bandwidth of the acoustic wave device as a resonator.

Acoustic wave devices can be provided with different ratios d/2p as in the case of the acoustic wave device having the resonant characteristics shown in FIG. 5. FIG. 6 is a graph showing the relationship between the ratio d/2p and the fractional bandwidth when the acoustic wave device 1 is used as a resonator.

As is apparent from the non-limiting example shown in FIG. 6, when the ratio $d/2p>0.25$, i.e., when the ratio $d/p>0.5$, the fractional bandwidth is lower than about 5%. In contrast, when the ratio $d/2p\leq 0.25$, i.e., the ratio $d/p\leq 0.5$, if the ratio d/p changes within the range from 0 to 0.5, the fractional bandwidth can be set to about 5% or higher, that is, a resonator having a high coupling coefficient can be provided, for example, with this configuration. When the ratio $d/2p<0.12$, i.e., the ratio d/p is lower than or equal to about 0.24, the fractional bandwidth can be increased to about 7% or higher, for example. In addition, if the ratio d/p is adjusted within this range, a resonator having a much wider fractional bandwidth can be obtained, so a resonator having a much higher coupling coefficient can be achieved. Therefore, it has been discovered and confirmed that, when the ratio d/p is set to about 0.5 or less, for example, a resonator that uses a bulk wave in the first-order thickness-shear mode with a high coupling coefficient can be provided.

As described above, at least one electrode pair can be one pair, and, in the case of one electrode pair, p is defined as the center-to-center distance between the centers of the adjacent first and second electrodes 3, 4. In the case of 1.5 or more electrode pairs, p can be defined as an average distance of the center-to-center distance s between the centers of any adjacent electrodes 3, 4 can be defined as p.

For the thickness d of the piezoelectric layer 2, when the piezoelectric layer 2 has thickness variations, an averaged value of the thicknesses can be used.

Figure 7:
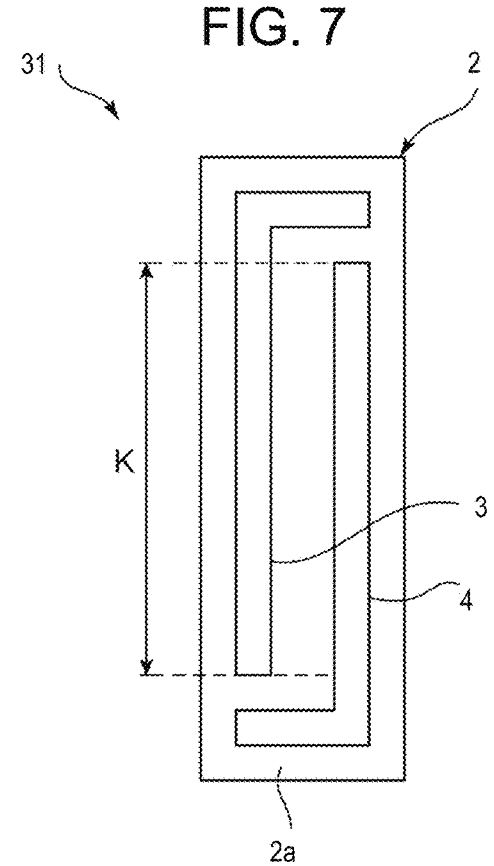
FIG. 7 is a plan view of an acoustic wave device according to a second exemplary embodiment.

FIG. 7 is a plan view of an acoustic wave device 31 according to a second exemplary embodiment. In the acoustic wave device 31, one electrode pair including the first and the second electrodes 3, 4 is provided on the first major surface 2*a* of the piezoelectric layer 2, although the first and the second electrodes 3, 4 can be provided on the second major surface 2*b* of the piezoelectric layer 2 in an alternative aspect. In FIG. 7, K is an overlap width. As described above, in the acoustic wave device 31, the number of electrode pairs can be one. In this case as well, when the ratio d/p is less than or equal to about 0.5, for example, a bulk wave in a first-order thickness-shear mode can be effectively excited.

Figure 8:
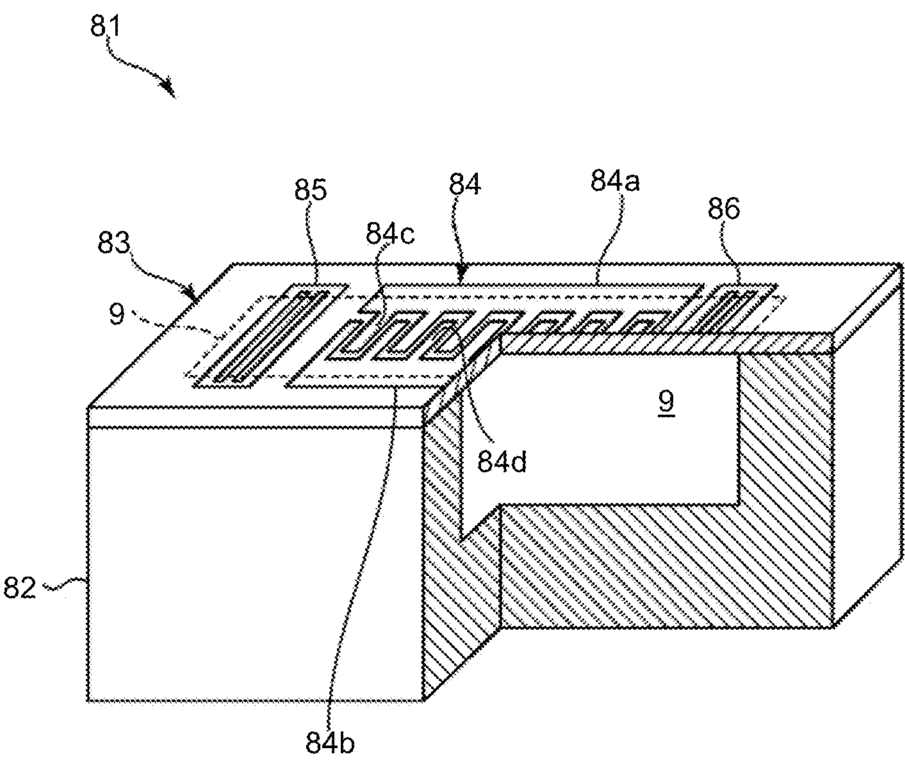
FIG. 8 is a partial cutaway, perspective view of an acoustic wave device according to a third exemplary embodiment.

FIG. 8 is a partial cutaway, perspective view of an acoustic wave device according to a third exemplary embodiment.

As shown, an acoustic wave device 81 includes a support substrate 82 that is provided with a recess opened to a top surface of the substrate 82. A piezoelectric layer 83 is laminated on the support substrate 82, which defines a cavity 9. An IDT electrode 84 is provided on the piezoelectric layer 83 above the cavity 9. In another exemplary aspect, the IDT electrode 84 can be provided on the piezoelectric layer 83 facing the cavity 9. Reflectors 85, 86 are disposed on both sides of the IDT electrode 84 in a propagation direction of acoustic waves. In FIG. 8, an outer peripheral edge of the cavity 9 is illustrated by a dashed line. The IDT electrode 84 includes a first busbar 84*a*, a second busbar 84*b*, electrodes 84*c* defining a plurality of first electrode fingers, and electrodes 84*d* defining a plurality of second electrode fingers. The electrodes 84*c* are connected to the first busbar 84*a*, and the electrodes 84*d* are connected to the second busbar 84*b*. The electrodes 84*c*, 84*d* are interdigitated with each other.

In the acoustic wave device 81, an alternating field can be applied to the IDT electrode 84 that is located above the cavity 9, whereby Lamb waves as plate waves can be excited. Further, the reflectors 85, 86 are disposed on both sides of the IDT electrode 84, whereby resonance characteristics based on the Lamb waves can be obtained. Thus, the acoustic wave device 81 can use plate waves.

Figures 14, 15, 16:
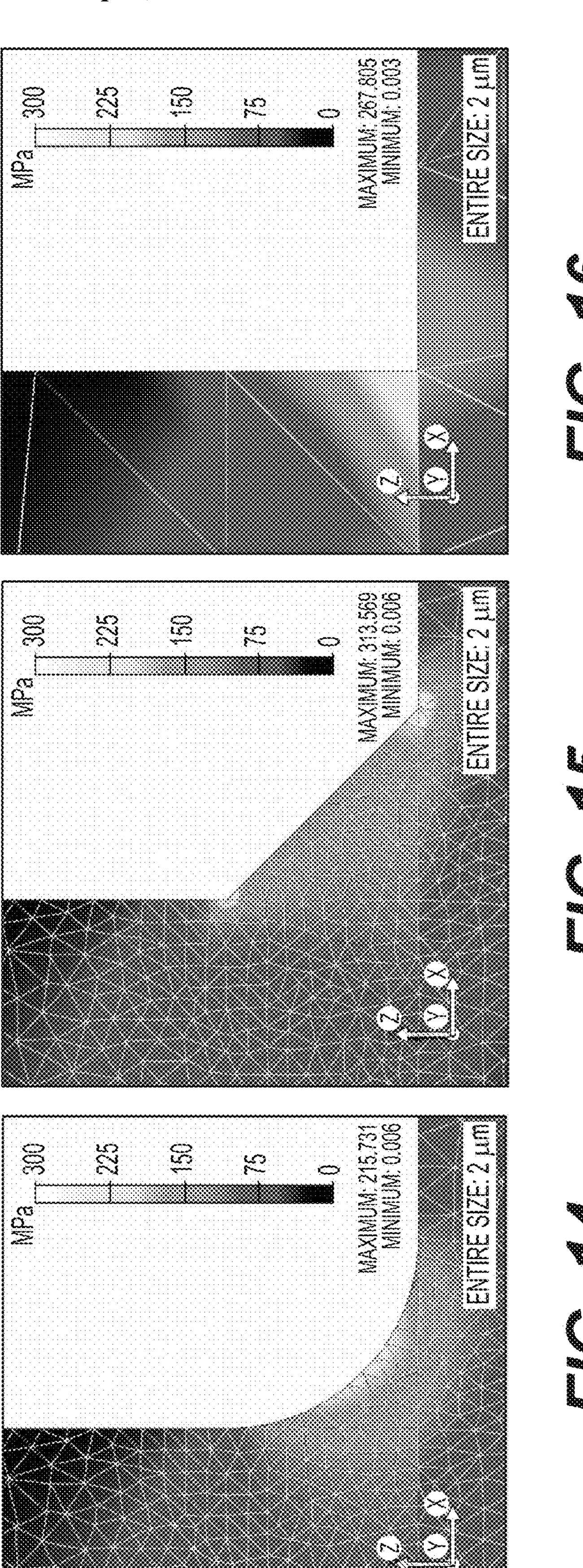
FIG. 14 is a diagram of the stress strength of an acoustic wave device with the second modified electrode.
FIG. 15 is a diagram of the stress strength of an acoustic wave device with the first modified electrode of an acoustic wave device of a comparative example.
FIG. 16 is a diagram of the stress strength of an acoustic wave device of a comparative example.

When the temperature of the acoustic wave device or the ambient temperature of the acoustic wave device changes, stress can be concentrated at an end of the electrode (either the first or the second electrode) adjacent to the piezoelectric layer as shown in FIG. 16, which can cause polarization reversal of the piezoelectric layer. When the piezoelectric layer decreases in thickness, the effects of the stress can increase. Exemplary embodiments of the present invention can suppress polarization reversal of the piezoelectric layer, even when the temperature of the acoustic wave device or the ambient temperature of the acoustic wave device changes.

Figure 9:
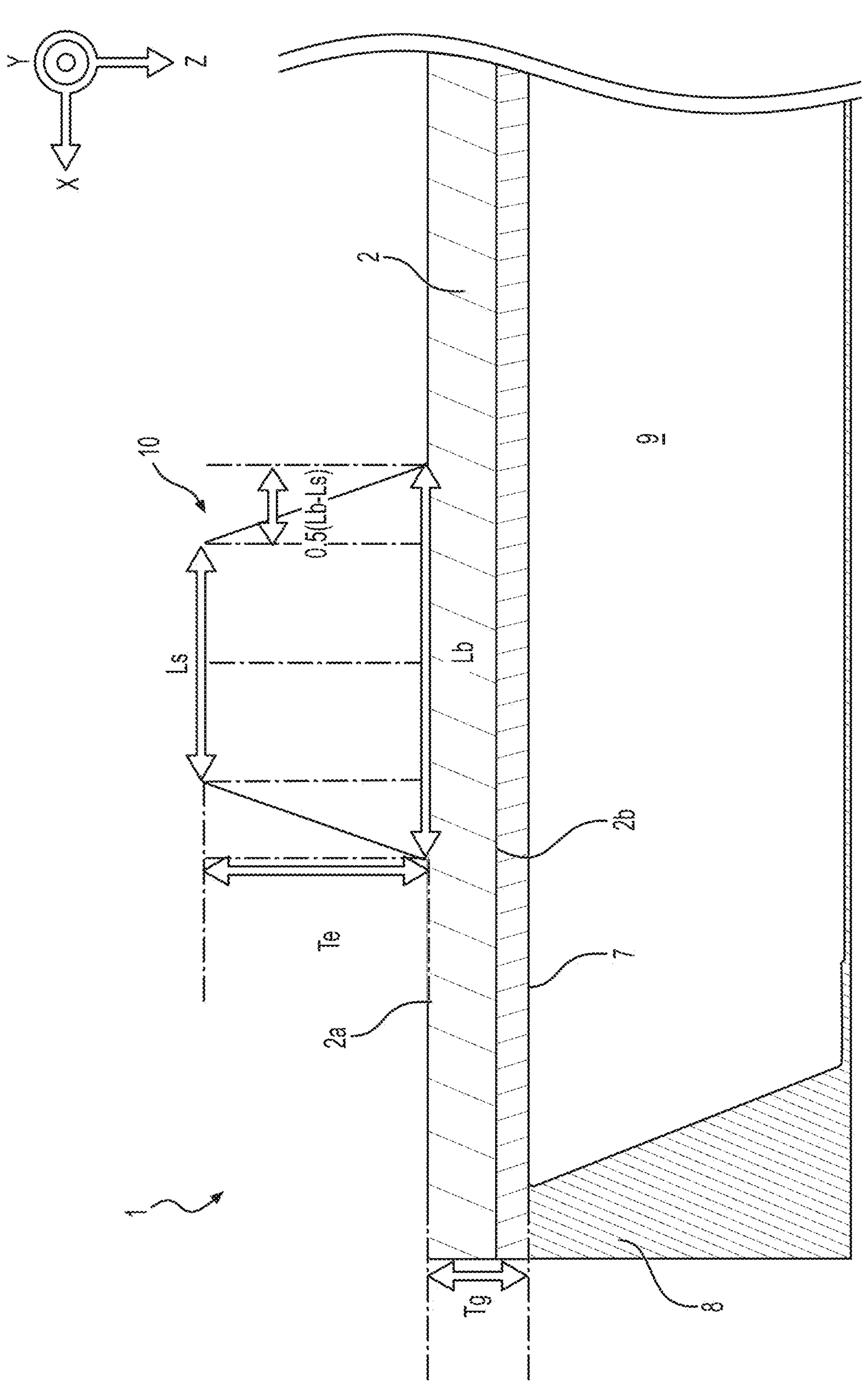
FIG. 9 is a close-up sectional view of an electrode of an acoustic wave device according to a fourth exemplary embodiment.
Figure 12:
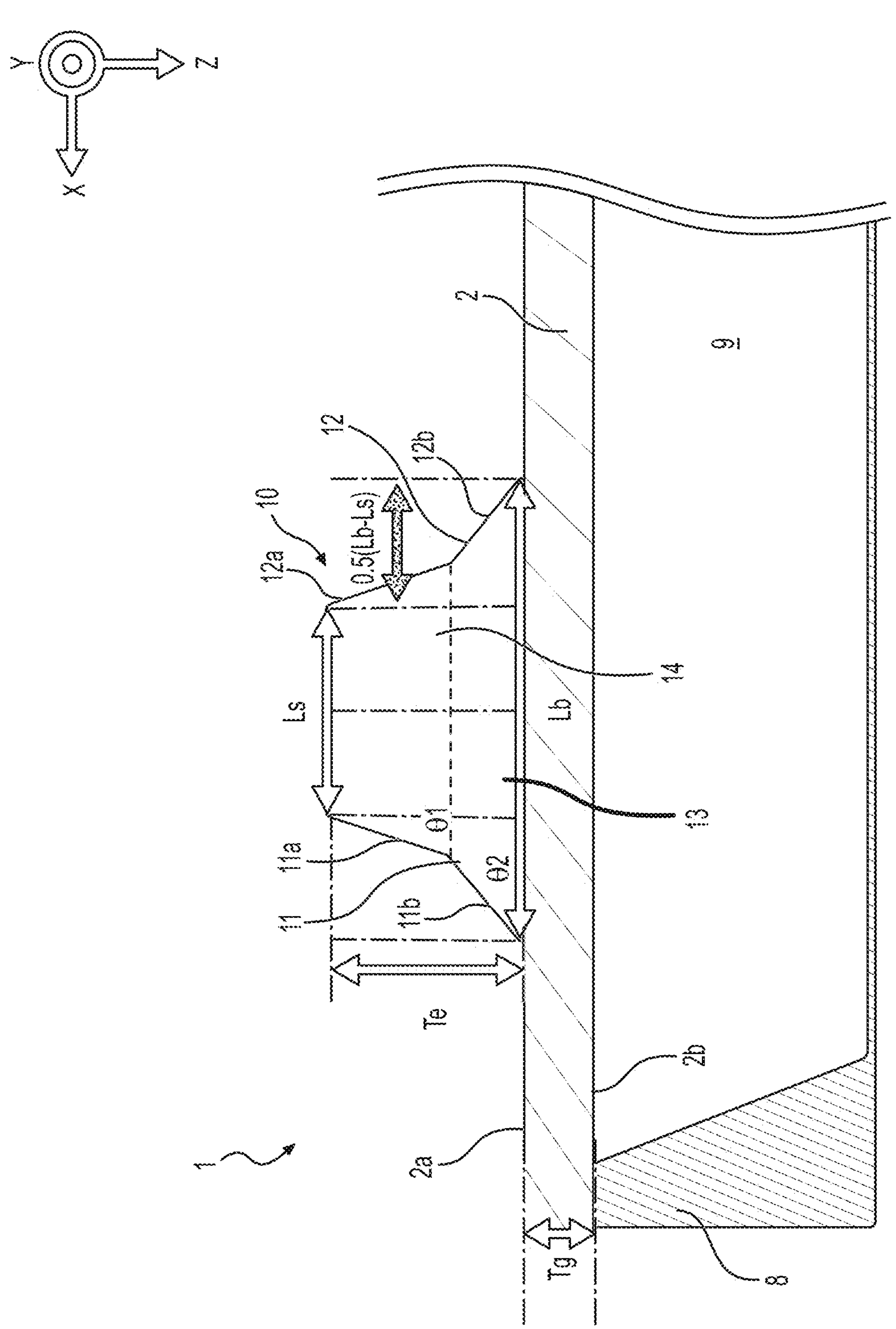
FIGS. 12 and 13 are close-up sectional views of first and second modified electrodes of acoustic wave devices according to the fourth exemplary embodiment.
Figure 13:
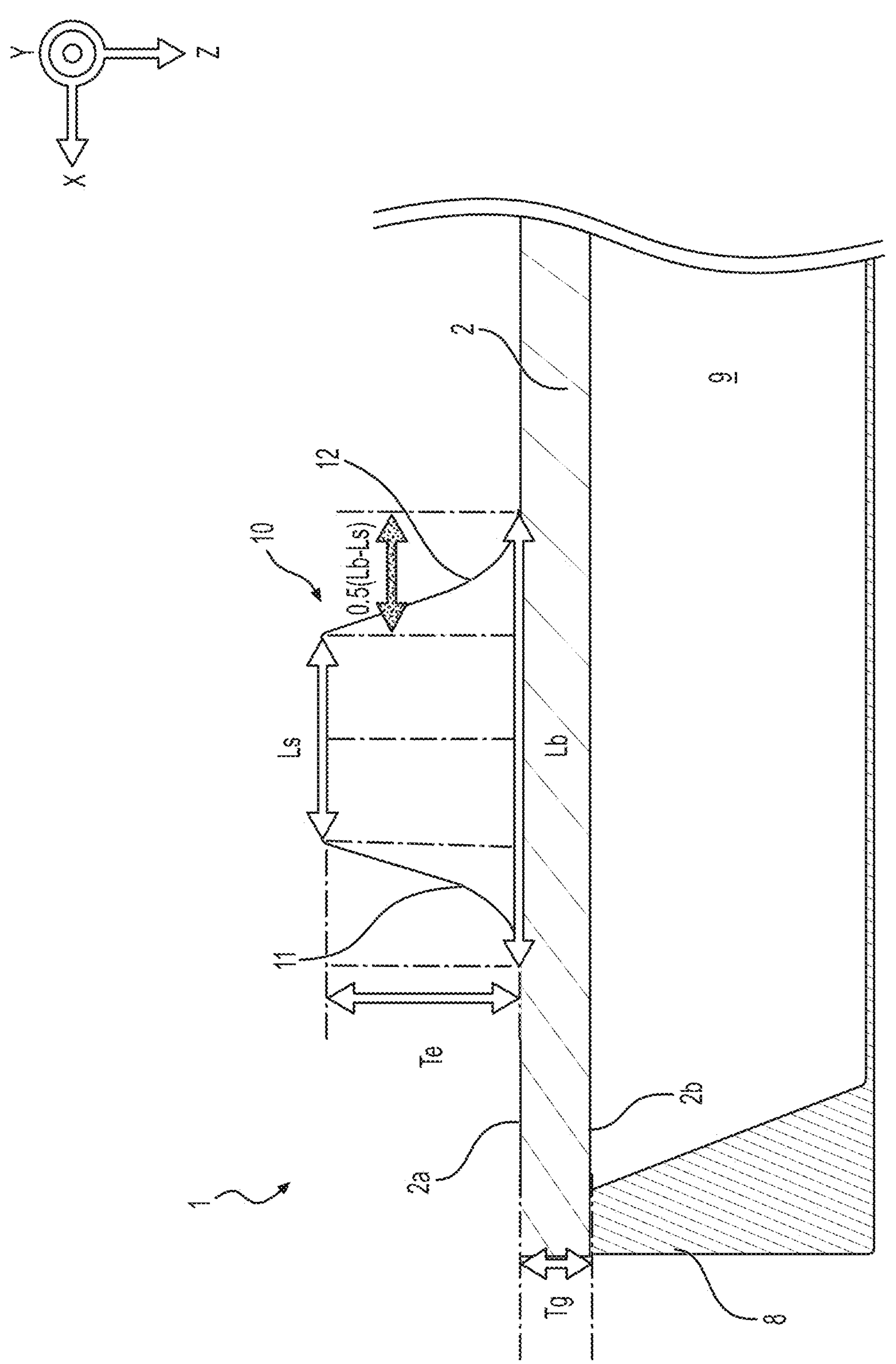

FIGS. 9, 12, and 13 show acoustic wave devices 1 that each includes a support substrate 8, an optional electrically insulating layer 7 (only shown in FIG. 9) on the support substrate 8, a piezoelectric layer 2 on the support substrate 8 and including first and second major surfaces 2*a*, 2*b*, a functional electrode 10 that can be the first or the second electrode 3 or 4, located on the first major surface 2*a* of the piezoelectric layer 2. The support substrate 8, the optional electrically insulating layer 7, and the piezoelectric layer 2 can define a cavity 9. In an exemplary aspect, the functional electrode 10 can be included in an IDT electrode. The functional electrode 10 can be covered by a protective layer (not shown) made of $SiO_2$ or the like. Although FIGS. 9, 12, and 13 show a single functional electrode 10, the shape of the functional electrode 10 can be applied to some or all of the first and/or the second electrodes 3, 4. For example, the shape of the functional electrode 10 shown in FIGS. 9, 12, and 13 can be applied to one or more pairs of the first and the second electrodes 3, 4.

The equation 0.5(Lb−Ls), which is a value of half the difference between a length Lb of the bottom surface of the functional electrode 10 and a length Ls of the top surface of the functional electrode 10, can be equal to or more than 0.002 Tg and less than Te, where Tg is the height from the first major surface 2*a* of the piezoelectric layer 2 to the cavity 9 (or the top surface of the support substrate 8) and Te is the thickness of the functional electrode 10, i.e., $0.002\ Tg \le 0.5(Lb-Ls) < Te$. The lengths Lb, Ls can be the maximum lengths of the top and the bottom surfaces of the functional electrode 10 if the lengths of the top and the bottom surfaces of the functional electrodes 10 varies. In this manner, even when the temperature of the acoustic wave device 1 or the ambient temperature around the acoustic wave device 1 changes, the stress exerted on an end of the functional electrode 10 on a piezoelectric-layer side of the functional electrode 10 is reduced.

In FIG. 9, an electrically insulating layer 7 is laminated on the second major surface 2*b* of the piezoelectric layer 2, on the side facing the support substrate 8. Therefore, Tg represents the sum of the thickness of the piezoelectric layer 2 and the thickness of the electrically insulating layer 7. The lamination of the electrically insulating layer 7 can be omitted in an alternative aspect. Moreover, the space or cavity 9 provided in a part of the support substrate 8, but may also be an air gap provided between the support substrate 8 and the piezoelectric layer 2.

Figure 10:
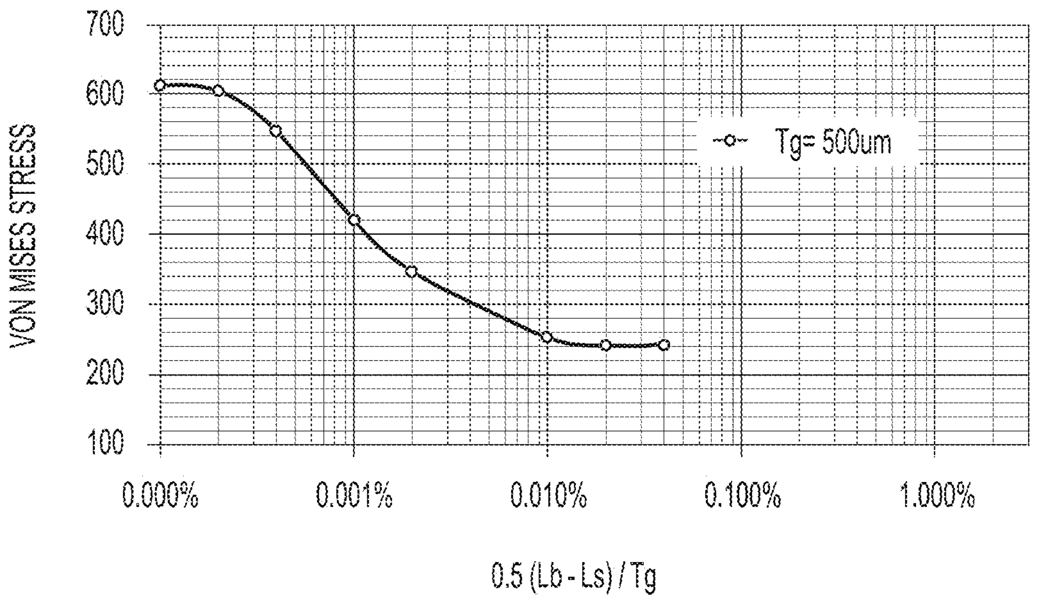
FIGS. 10 and 11 are graphs showing the relationship between the von Mises stress and the equation 0.5(Lb−Ls)/Tg.
Figure 11:
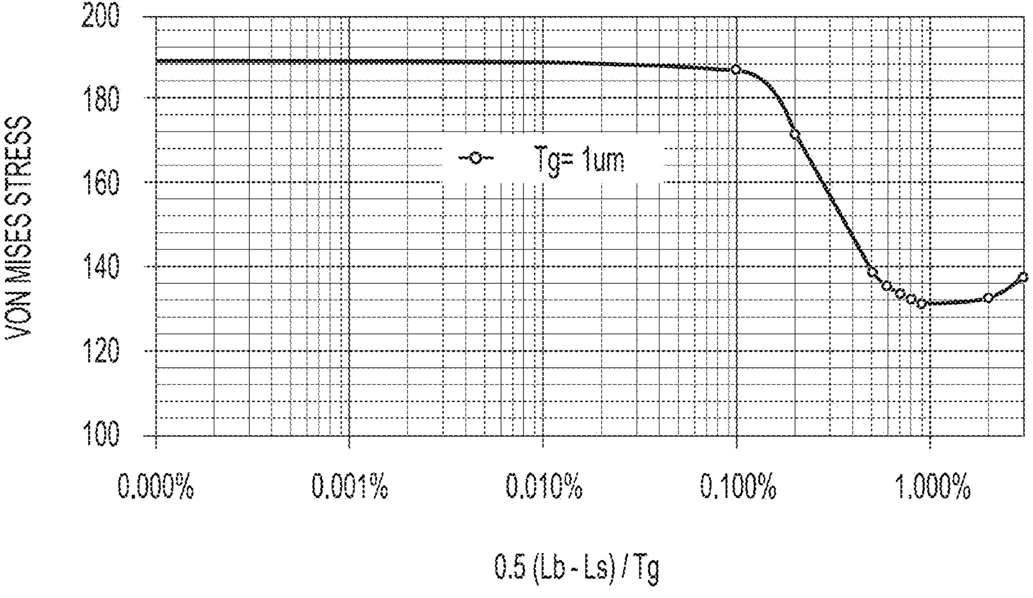

FIGS. 10 and 11 are graphs showing a relation between the equation 0.5(Lb−Ls)/Tg and the stress strength. FIG. 10 shows the relationship between the equation 0.5(Lb−Ls)/Tg and the stress strength when the thickness Tg is 500 μm, and FIG. 11 shows the relationship between the equation 0.5 (Lb−Ls)/Tg and the stress strength when the thickness Tg is 1 μm. As seen by comparing FIGS. 10 and 11, the stress decreases when the thickness Tg is reduced from 500 μm to 1 μm, and the equation 0.5(Lb−Ls)/Tg is equal to or more than 0.002. It can be seen that the stress further decreases when the thickness Tg is reduced from 500 μm to 1 μm, and the equation 0.5(Lb−Ls)/Tg is equal to or more than 0.009. It can also be seen that the stress stabilizes at a low level when the thickness Tg is reduced from 500 μm to 1 μm, and the equation 0.5(Lb−Ls)/Tg is equal to or more than 0.02. If the equation 0.5(Lb−Ls) exceeds the thickness Te, manufacturing can be difficult, so the equation 0.5(Lb−Ls)/Tg can be set to less than Te to make manufacturing easier.

FIG. 12 shows a first modification of the functional electrode 10. In this aspect, the functional electrode 10 can have a shape as shown in FIG. 12 including a first side 11 with first and second surfaces 11*a*, 11*b* and including a second side 12 with first and second surfaces 12*a*, 12*b*. The first surface 11*a* can include a first angle θ1 that is the angle between the first surface 11*a* and the first major surface 2*a*, and the second surface 11*b* can include a second angle θ2 that is the angle between the second surface 11*b* and the first major surface 2*a*, and that is smaller than the first angle θ1, i.e., θ2<θ1. The first and second surfaces 12*a*, 12*b* of the second side 12 can include the same or different angles as the first side. If the angles of the first and second sides 11, 12 are the same, then the functional electrode 10 is symmetrical about a vertical axis through the middle of the functional electrode 10. The stress at the end of the functional electrode 10 on the piezoelectric-layer side of the functional electrode 10 can then be distributed, and polarization reversal of the piezoelectric layer 2 can be reduced or suppressed.

The functional electrode 10 can include at least a first layer 13 and a second layer 14 laminated on the first layer 13. The first layer 13 can be made with a main component of any one of Cu, Ti, Mo, W, Pt, Ni, and Cr, and the second layer 14 can be made of Al. With this configuration, a desired resistance of the functional electrode 10 can be achieved, or reliability and adhesion of the functional electrode 10 can be improved. The functional electrode 10 can be covered by a protective layer (not shown) made of $SiO_2$ or the like.

FIG. 13 shows a second modification of the functional electrode 10. The functional electrode 10 can have a shape as shown in FIG. 13. The first side 11 and/or the second side 12 can include a curved portion. Moreover, the first and the second sides 11, 12 can have the same shape or different shapes in various exemplary aspects. With a curved portion, the stress at the end of the functional electrode 10 on the piezoelectric-layer side of the functional electrode 10 can be distributed, and polarization reversal of the piezoelectric layer 2 can be reduced or suppressed. The functional electrode 10 can be covered by a protective layer (not shown) made of $SiO_2$ or the like.

FIGS. 14-16 show the stress strengths on the acoustic wave devices according to a comparative example (FIG. 16), the first modification of the functional electrode 10 (FIG. 15), and the second modification of the functional electrode 10 (FIG. 14), respectively. The stress is smaller in the acoustic wave devices in FIGS. 14 and 15, compared with the stress in the acoustic wave device in FIG. 16. The stress exerted on the piezoelectric layer is even less in the acoustic wave device in FIG. 14, compared with the stress in the acoustic wave device in FIG. 15.

It should be noted that each of the exemplary embodiments described herein is illustrative and that partial substitutions or combinations of configurations are possible among different exemplary embodiments. While exemplary embodiments of the present invention have been described above, it is to be understood that variations and modifications will be apparent to those skilled in the art without departing from the scope and spirit of the present invention.

What is claimed:

1. An acoustic wave device comprising:

a support substrate;

a piezoelectric layer including first and second major surfaces that oppose each other, with the second major surface extending in a first direction with respect to the first major surface;

at least one pair of functional electrodes that face each other in a second direction that intersects the first direction and that are adjacent to each other on one of the first and second major surfaces; and a space defining either a cavity in the support substrate or an air gap between the support substrate and the piezoelectric layer, wherein the space overlaps with at least a portion of the at least one pair of functional electrodes in a planar view in the first direction, and wherein a value of half a difference between a maximum length of a bottom surface of one of the at least one pair of functional electrodes in the second direction and a maximum length of a top surface of the one of the at least one pair of functional electrodes in the second direction is equal to or more than about 0.2% of a thickness of the piezoelectric layer from the first major surface to the space, and is equal to or less than a thickness of the one of the at least one pair of functional electrodes in the first direction.

2. The acoustic wave device according to claim 1, wherein the value of half the difference between the maximum length of the bottom surface of the one of the least one pair of functional electrodes in the second direction and the maximum length of the top surface of the one of the at least one pair of functional electrodes in the second direction is equal to or more than 0.9% of the thickness of the piezoelectric layer from the first major surface to the space.

3. The acoustic wave device according to claim 1, wherein the value of half the difference between the maximum length of the bottom surface of the one of the at least one pair of functional electrodes in the second direction and the maximum length of the top surface of the one of the at least one pair of functional electrodes in the second direction is equal to or more than 2% of the thickness of the piezoelectric layer from the first major surface to the space.

4. The acoustic wave device according to claim 1, wherein in a cross section that includes the first direction and the second direction, the one of the at least one pair of functional electrodes includes a first side and a second side, and with at least one of the first side and the second side including a curved portion.

5. The acoustic wave device according to claim 1, wherein a thickness of the piezoelectric layer between the first and second major surfaces is equal to or more than about 0.05 μm and equal to or less than about 1 μm.

6. The acoustic wave device according to claim 1, further comprising an electrically insulating layer between the piezoelectric layer and the support substrate.

7. The acoustic wave device according to claim 1, wherein the one of the at least one pair of functional electrodes includes a plurality of first electrodes, a first busbar electrode connected to the plurality of first electrodes, a plurality of second electrodes, and a second busbar electrode connected to the plurality of second electrodes.

8. The acoustic wave device according to claim 7, wherein a thickness of the piezoelectric layer between the first and second major surfaces is equal to or more than 2p, where p is a center-to-center distance between a first electrode of the plurality of first electrodes and a second electrode of the plurality of second electrodes that are adjacent to each.

9. The acoustic wave device according to claim 1, wherein the piezoelectric layer comprises one of lithium niobate or lithium tantalate.

10. The acoustic wave device according to claim 9, wherein the acoustic wave device is configured, such that a first-order thickness-shear mode bulk wave is used as a main wave.

11. The acoustic wave device according to claim 10, wherein:

the one of the least one pair of functional electrodes includes at least one pair of electrodes that face each other, and a ratio d/p is equal to or less than about 0.5, where d is a thickness of the piezoelectric layer between the first and second major surfaces, and p is a center-to-center distance between the at least one pair of electrodes that face each other and are adjacent to each other.

12. The acoustic wave device according to claim 1, wherein the functional electrode is an IDT electrode, and a plate wave is used as a main wave.

13. An acoustic wave device comprising:

a support substrate that includes top and bottom surface;

a piezoelectric layer supported by the top surface of the support substrate and including opposing first and second surfaces; and an electrode on at least one of the first and second surfaces of the piezoelectric layer and including top and bottom surfaces, wherein at least a portion of the electrode overlaps a cavity in the substrate or an air gap between the substrate and the piezoelectric layer, and wherein $0.002\ Tg \leq 0.5(Lb-Ls) < Te$, where Ls is a maximum length of the top surface of the electrode, Lb is a maximum length of the bottom surface of the electrode, Tg is a distance between the first surface of the piezoelectric layer and the top surface of the support substrate, and Te is a thickness of the electrode.

14. The acoustic wave device according to claim 13, wherein $0.009\ Tg \leq 0.5(Lb-Ls)$.

15. The acoustic wave device according to claim 13, wherein 0.02 Tg≤0.5(Lb−Ls).

16. The acoustic wave device according to claim 13, wherein at least one of a first side and a second side of the electrode includes a curved portion.

17. The acoustic wave device according to claim 13, wherein the electrode includes first electrodes, a first busbar electrode connected to the first electrodes, second electrodes, and a second busbar electrode connected to the second electrodes.

18. The acoustic wave device according to claim 13, wherein the piezoelectric layer comprises one of lithium niobate or lithium tantalate.

19. The acoustic wave device according to claim 18, wherein the acoustic wave device is configured, such that a first-order thickness-shear mode bulk wave is used as a main wave.

20. The acoustic wave device according to claim 13, wherein the electrode is an IDT electrode, and a plate wave is used as a main wave.

* * * * *